United States Patent
Kittl et al.

(10) Patent No.: US 9,601,586 B1
(45) Date of Patent: Mar. 21, 2017

(54) METHODS OF FORMING SEMICONDUCTOR DEVICES, INCLUDING FORMING A METAL LAYER ON SOURCE/DRAIN REGIONS

(71) Applicant: Samsung Electronics Co., Ltd., Suwon-si, Gyeonggi-do (KR)

(72) Inventors: Jorge A. Kittl, Round Rock, TX (US); Joon Goo Hong, Austin, TX (US); Mark S. Rodder, Dallas, TX (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/017,352

(22) Filed: Feb. 5, 2016

Related U.S. Application Data

(60) Provisional application No. 62/249,674, filed on Nov. 2, 2015.

(51) Int. Cl.
  H01L 21/336 (2006.01)
  H01L 29/417 (2006.01)
  H01L 29/66 (2006.01)
  H01L 29/45 (2006.01)
  H01L 21/8234 (2006.01)
  H01L 29/08 (2006.01)

(52) U.S. Cl.
  CPC ............ H01L 29/41791 (2013.01); H01L 21/823418 (2013.01); H01L 21/823431 (2013.01); H01L 21/823437 (2013.01); H01L 29/0847 (2013.01); H01L 29/45 (2013.01); H01L 29/66545 (2013.01)

(58) Field of Classification Search
  CPC ......... H01L 21/823431; H01L 29/7853; H01L 29/41791; H01L 29/66545
  USPC ................................................. 438/299
  See application file for complete search history.

(56) References Cited

U.S. PATENT DOCUMENTS

| | | | |
|---|---|---|---|
| 5,834,846 A | 11/1998 | Shinriki et al. | |
| 7,456,471 B2 | 11/2008 | Anderson et al. | |
| 7,679,133 B2 | 3/2010 | Son et al. | |
| 7,868,412 B2 | 1/2011 | Okamoto et al. | |
| 7,932,556 B2 | 4/2011 | Pan | |
| 8,258,057 B2 | 9/2012 | Kuhn et al. | |
| 8,415,250 B2 | 4/2013 | Alptekin et al. | |
| 8,553,466 B2 | 10/2013 | Han et al. | |
| 8,559,235 B2 | 10/2013 | Yoon et al. | |
| 8,569,810 B2 | 10/2013 | Yu et al. | |
| 8,654,587 B2 | 2/2014 | Yoon et al. | |
| 2011/0233648 A1 | 9/2011 | Seol et al. | |
| 2012/0187460 A1 | 7/2012 | Lavoie et al. | |
| 2013/0171795 A1 | 7/2013 | Pei et al. | |
| 2013/0187206 A1 | 7/2013 | Mor et al. | |
| 2013/0221414 A1 | 8/2013 | Zhao et al. | |
| 2014/0001520 A1 | 1/2014 | Glass et al. | |
| 2014/0203370 A1 | 7/2014 | Maeda et al. | |
| 2014/0206190 A1 | 7/2014 | Li et al. | |
| 2014/0239395 A1 | 8/2014 | Basker et al. | |
| 2014/0273369 A1 | 9/2014 | Wei et al. | |

(Continued)

Primary Examiner — David S Blum
(74) Attorney, Agent, or Firm — Myers Bigel, P.A.

(57) ABSTRACT

Methods of forming a semiconductor device are provided. A method of forming a semiconductor device includes forming a metal layer on source/drain regions of respective semiconductor structures, after replacing a dummy gate structure of the semiconductor device with a metal gate structure. The method includes forming a contact structure that overlaps the metal layer on one or more, but not all, of the semiconductor structures. Moreover, an insulating material is between the source/drain regions.

20 Claims, 22 Drawing Sheets

(56) References Cited

U.S. PATENT DOCUMENTS

| | | |
|---|---|---|
| 2015/0076609 A1 | 3/2015 | Xie et al. |
| 2015/0079751 A1 | 3/2015 | Alptekin et al. |
| 2015/0102422 A1 | 4/2015 | Cai et al. |

METHODS OF FORMING SEMICONDUCTOR DEVICES, INCLUDING FORMING A METAL LAYER ON SOURCE/DRAIN REGIONS

CLAIM OF PRIORITY

The present application claims the benefit of U.S. Provisional Patent Application Ser. No. 62/249,674, filed on Nov. 2, 2015, entitled Partial TS with Unmerged Fins and Wrap-Around Contacts, the disclosure of which is hereby incorporated herein in its entirety by reference.

FIELD

The present disclosure generally relates to the field of semiconductor devices and, more particularly, to semiconductor devices including layers on source/drain regions.

BACKGROUND

The performance of a semiconductor device may be degraded by parasitic resistance and parasitic capacitance. For example, parasitic resistance and parasitic capacitance may be undesired elements that degrade the performance of advanced Complementary Metal Oxide Semiconductor (CMOS) devices. Accordingly, as semiconductor devices are scaled down, it may be helpful to reduce parasitic resistance and parasitic capacitance to achieve devices with good Alternating Current (AC) performance.

SUMMARY

Various embodiments of the present disclosure may provide a method of forming a semiconductor device. The method may include replacing a dummy gate structure with a metal gate structure. The method may include forming an opening over spaced-apart source/drain regions of respective semiconductor structures. The method may include forming a metal layer in the opening, on the spaced-apart source/drain regions, after replacing the dummy gate structure with the metal gate structure. The method may include forming a first insulating material on the metal layer. The first insulating material, and/or a second insulating material that is formed before forming the metal layer, may be between the spaced-apart source/drain regions. Moreover, the method may include forming, in the first insulating material, a contact structure that only partially overlaps the metal layer.

In various embodiments, forming the opening may include exposing at least a portion of each of the spaced-apart source/drain regions. Alternatively, forming the opening may include exposing at least a portion of a silicide layer or etch stop layer on each of the spaced-apart source/drain regions.

According to various embodiments, adjacent ones of the source/drain regions may be spaced apart from each other by at least five (5) nanometers. Moreover, the semiconductor structures may include respective fin-shaped semiconductor structures, and forming the contact structure may include forming the contact structure over only one of the fin-shaped semiconductor structures.

In various embodiments, the opening may be a trench, and forming the metal layer may include forming the metal layer in the trench. The method may include removing first portions of the metal layer from sidewalls of the trench, and forming the first insulating material may include forming the first insulating material on second portions of the metal layer that remain in the trench after removing the first portions of the metal layer from the sidewalls of the trench. A first thickness of the first insulating material may be equal to or thicker than a second thickness of the second portions of the metal layer, and the second thickness of the second portions of the metal layer may be between two (2) and twenty (20) nanometers.

According to various embodiments, the opening may be a first opening that is a trench. Forming the first insulating material may include forming the first insulating material in the trench. Moreover, forming the contact structure may include forming, in the first insulating material, a second opening that is smaller than the trench. The contact structure may be formed in the second opening. In some embodiments, forming the metal layer may include directionally depositing the metal layer in the trench so that the metal layer is thicker on the spaced-apart source/drain regions than on sidewalls of the trench.

In various embodiments, the method may include forming an etch stop layer on the spaced-apart source/drain regions. Forming the opening may include forming the opening while the etch stop layer is on the spaced-apart source/drain regions, before forming the metal layer. In some embodiments, forming the etch stop layer may include forming the etch stop layer on top surfaces and side surfaces of the spaced-apart source/drain regions, before replacing the dummy gate structure with the metal gate structure. Moreover, in some embodiments, forming the metal layer may include forming the metal layer on the top surfaces and the side surfaces of the spaced-apart source/drain regions.

According to various embodiments, forming the etch stop layer may include forming a silicide layer on the spaced-apart source/drain regions, before replacing the dummy gate structure with the metal gate structure. In some embodiments, forming the silicide layer may include forming the silicide layer on top surfaces and side surfaces of the spaced-apart source/drain regions, before replacing the dummy gate structure with the metal gate structure.

In various embodiments, forming the opening may include forming the opening in the second insulating material, over at least a portion of each of the spaced-apart source/drain regions, before forming the metal layer. In some embodiments, forming the opening in the second insulating material may include at least partially removing the second insulating material from between the spaced-apart source/drain regions of the respective semiconductor structures. Moreover, forming the metal layer may include conformally forming the metal layer on top surfaces and side surfaces of the spaced-apart source/drain regions.

According to various embodiments, forming the first insulating material may include forming the first insulating material between the side surfaces of the spaced-apart source/drain regions, after forming the metal layer on the top surfaces and the side surfaces of the spaced-apart source/drain regions. Alternatively, the method may include forming the second insulating material between side surfaces of the spaced-apart source/drain regions, before forming the metal layer, and forming the metal layer may include forming the metal layer on top surfaces of the spaced-apart source/drain regions and on the second insulating material that is between the side surfaces of the spaced-apart source/drain regions. Spaces between the spaced-apart source/drain regions may thus include mostly the second insulating material.

A method of forming a semiconductor device, according to various embodiments, may include forming unmerged source/drain regions on semiconductor structures. The method may include replacing a dummy gate structure with a metal gate structure. The method may include forming a metal layer that connects the unmerged source/drain regions with each other, after replacing the dummy gate structure with the metal gate structure. The method may include forming a contact structure that overlaps the metal layer on one or more, but not all, of the semiconductor structures. Moreover, an insulating material may be between the unmerged source/drain regions.

In various embodiments, a thickness of the metal layer on the unmerged source/drain regions may be between two (2) and twenty (20) nanometers, and adjacent ones of the unmerged source/drain regions may be spaced apart from each other by at least five (5) nanometers. Moreover, forming the contact structure may include forming the contact structure on less than half of an entire uppermost surface of the metal layer.

According to various embodiments, the method may include forming the dummy gate structure on a fin structure among the semiconductor structures. Replacing the dummy gate structure may include removing the dummy gate structure and forming the metal gate structure in place of the dummy gate structure. The method may include forming a trench that spans at least a portion of each of the unmerged source/drain regions. Forming the metal layer may include forming the metal layer in the trench. Moreover, the method may include forming the insulating material, and/or another insulating material, on the metal layer.

A method of forming a semiconductor device, according to various embodiments, may include forming a metal layer on source/drain regions of respective fin-shaped semiconductor structures, after a dummy gate structure of the semiconductor device has been replaced with a metal gate structure. Adjacent ones of the source/drain regions may be spaced apart from each other by at least two (2) nanometers. The method may include forming an insulating material on the metal layer. The insulating material, and/or an isolation region that is formed before forming the metal layer, may be between the source/drain regions. Moreover, the method may include forming, in the insulating material, a contact structure that contacts only a portion of the metal layer.

In various embodiments, a thickness of the metal layer on the source/drain regions may be between two (2) and twenty (20) nanometers, and the adjacent ones of the source/drain regions may be spaced apart from each other by at least five (5) nanometers. The method may include forming a trench that spans at least a portion of each of the source/drain regions. Forming the metal layer may include forming the metal layer in the trench. Forming the insulating material on the metal layer may include forming a first insulating layer on the metal layer, in the trench. The method may include removing a portion of the first insulating layer to expose vertically-extending portions of the metal layer. The method may include removing the vertically-extending portions of the metal layer that are exposed. Moreover, the method may include forming a second insulating layer over the metal layer and the first insulating layer, after removing the vertically-extending portions of the metal layer.

Other methods and devices according to embodiments of the present disclosure will be or become apparent to one with skill in the art upon review of the following drawings and detailed description. It is intended that all such additional methods and devices be included within this description, be within the scope of present inventive concepts, and be protected by the accompanying claims. Moreover, it is intended that all embodiments disclosed herein can be implemented separately or combined in any way and/or combination.

DETAILED DESCRIPTION

As used herein, the term "unmerged" may refer to gaps (rather than any physical contact between facing portions) between semiconductor materials that form the sources (or drains) of adjacent structures. When, on the other hand, source/drain regions are merged with each other in a device having semiconductor fins, it may not be possible to provide wrap-around metal contact close to the bottom of the fins. For tall fins, a top contact may result in a small metal and/or source/drain contact area, which may result in high contact resistance. Moreover, spreading resistance and extension resistance may also be high because the current density close to the bottom of a fin is small when using top contacts. One possible solution is the use of deep recessed contacts, which may increase the contact area and provide larger current densities toward the bottom of a fin. Deep recesses, however, can significantly reduce strain induced from the substrate (e.g., when an underlying Strain Relaxed Buffer (SRB) is used as stressor). Deep recesses thus may not be a good solution and may be detrimental to device performance. Various embodiments described herein, however, may provide low parasitic resistance and low parasitic capacitance without compromising the performance boost of SRB induced strain. For example, various embodiments described herein may provide operations that achieve partial strap, low parasitic capacitance contacts for several fins with unmerged source/drain regions.

Various embodiments described herein may provide operations that achieve low parasitic resistance, capacitance (RC) contacts to structures such as fin-shaped Field Effect Transistors (FinFETs), or nano-sheets, with unmerged sources and drains. The operations may provide structures with (i) wrap-around contacts, thus reducing parasitic resistance, for unmerged fins and (ii) partial contact hole opening straps (by providing an additional thin layer that connects the source/drain regions of adjacent fins), thus reducing gate-to-contact capacitance.

As used herein, the words "wrap-around contacts" refers to contacts that wrap around (e.g., continuously extend from top surfaces to side surfaces of) unmerged source/drain regions. In particular, the operations described according to various embodiments herein may provide both (a) wrap-around contacts and (b) partial overlap of contact plug to source/drain strap (and consequently gate projection), thus resulting in lower parasitic resistance as well as lower gate-to-contact parasitic capacitance. Wrap-around unmerged source/drain regions may provide low parasitic resistance even for tall fins.

Figure 1A:
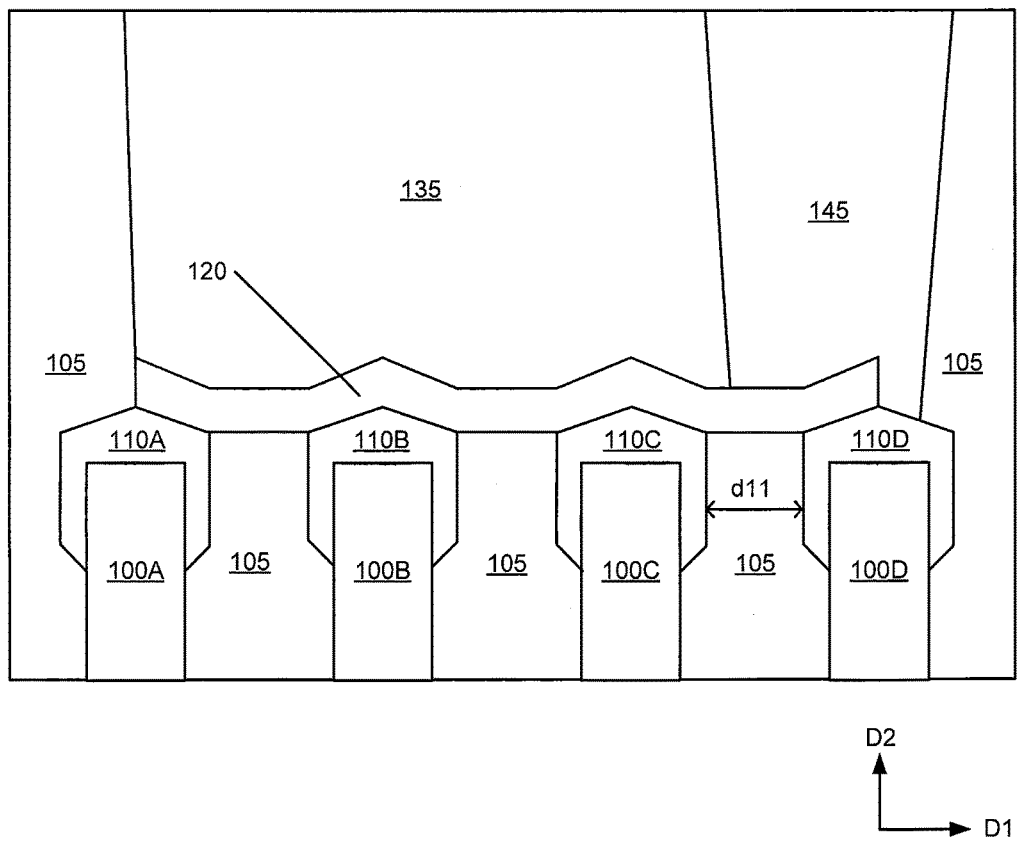
FIGS. 1A and 1B are cross-sectional views illustrating semiconductor devices, according to various embodiments of present inventive concepts.
Figure 1B:
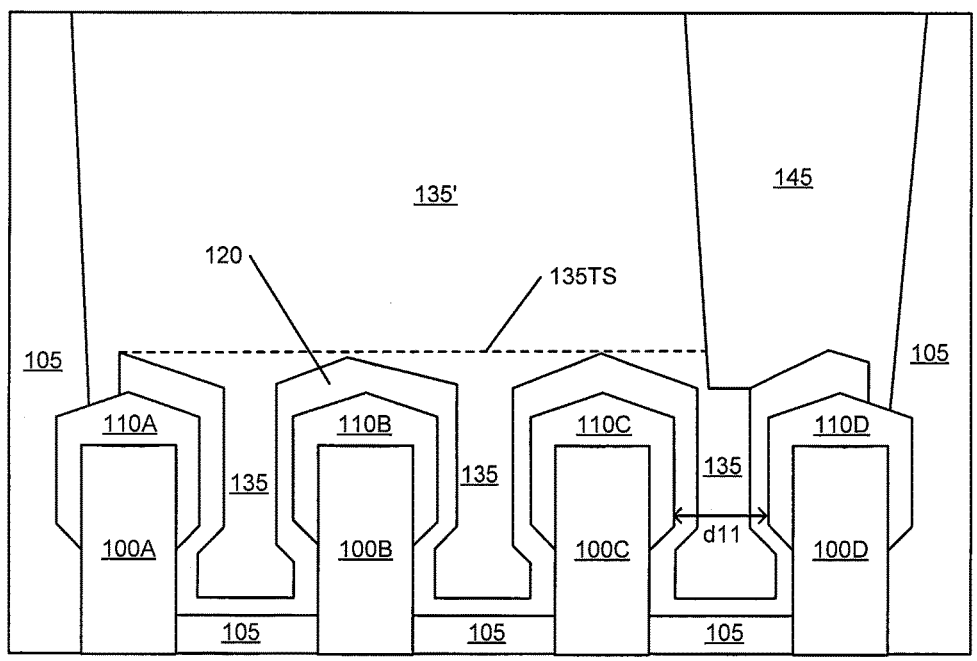

FIGS. 1A and 1B are cross-sectional views illustrating semiconductor devices, according to various embodiments of present inventive concepts. Referring now to FIG. 1A, a semiconductor device may include a structure that includes a plurality of semiconductor structures 100. In some embodiments, the semiconductor structures 100 may be respective fin-shaped structures. Although four (4) fin-shaped semiconductor structures 100A-100D are illustrated in FIG. 1A, the present inventive entity appreciates that more or fewer semiconductor structures 100 may be included. For example, two (2), three (3), four (4), five (5), six (6), or more semiconductor structures 100 may be included.

Each of the semiconductor structures 100 may have respective source/drain regions 110 thereon. For example, FIG. 1A illustrates source/drain regions 110A-110D on the fin-shaped semiconductor structures 100A-100D, respectively. The source/drain regions 110A-110D may thus be source/drain regions of a fin-shaped Field Effect Transistor (FinFET). As further illustrated by FIG. 1A, the source/drain regions 110 may be spaced apart from each other in a direction D1, and may thus be referred to herein as "unmerged" source/drain regions. In other words, the source/drain regions 110 have gaps therebetween so that facing portions of the source/drain regions 110 do not contact each other. For example, adjacent ones of the source/drain regions 110 may be spaced apart from each other by at least two (2) nanometers (nm). In some embodiments, a closest distance (e.g., a distance d11), in the direction D1, between adjacent ones of the source/drain regions 110 may be at least five (5) nm.

The semiconductor structures 100 may also be spaced apart from each other in the direction D1. An insulating material 105 may be between adjacent ones of the semiconductor structures 100 and/or between adjacent ones of the source/drain regions 110. Accordingly, the insulating material 105 may be referred to herein as an isolation region. In particular, the insulating material 105 may provide an isolation layer/region that defines active portions of the semiconductor structures 100A-100D that are spaced apart from each other in the direction D1.

The source/drain regions 110 may be connected (e.g., electrically connected) to each other by a metal layer 120. The metal layer 120 may be any metallic film (and thus is not limited to only semiconductor-metal alloys such as silicides). In some embodiments, as illustrated by FIG. 1A, the metal layer 120 may extend continuously from a top surface of one source/drain region 110A to respective top surfaces of a plurality of other source/drain regions 110B-110D. An insulating material 135 and a contact structure 145 may be on the metal layer 120.

Referring now to FIG. 1B, the metal layer 120 may optionally be on side surfaces, in addition to top surfaces, of the respective source/drain regions 110. In other words, the metal layer 120 may wrap around the source/drain regions 110. Moreover, the insulating material 135 may optionally be between respective side surfaces of adjacent ones of the source/drain regions 110. For example, FIG. 1B illustrates that the insulating material 135 is between a side surface of the source/drain region 110C and a side surface of the source/drain region 110D. A further insulating material 135 may optionally be on the insulating material 135. For example, moving vertically upward in a direction D2, the insulating material 135 may transition to the insulating material 135' at a location 135TS that is near a top surface of the metal layer 120 on top surfaces of the source/drain regions 110. Moreover, the present inventive entity appreciates that the insulating materials 105, 135, and/or 135' may be different layers/regions of the same insulating material or may be different insulating materials.

Referring again to FIGS. 1A and 1B, the present inventive entity appreciates that having mostly the insulating material 105 (FIG. 1A), and/or mostly the insulating material 135 (FIG. 1B), between the source/drain regions 110A-110D may provide a lower capacitance than having mostly metal between the source/drain regions 110A-110D.

Figure 2A:
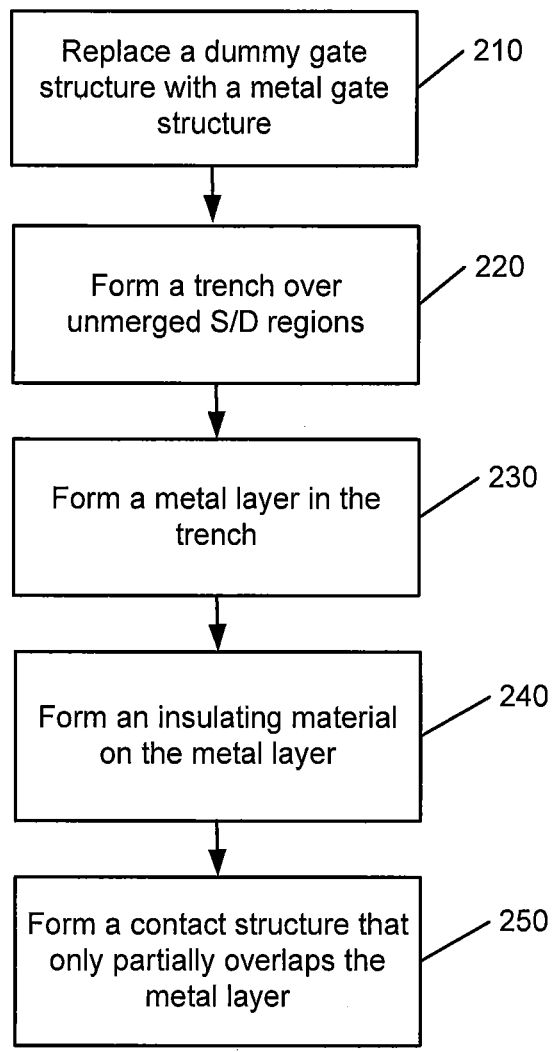
FIGS. 2A and 2B are flowcharts illustrating operations of forming semiconductor devices, according to various embodiments of present inventive concepts.
Figure 2B:
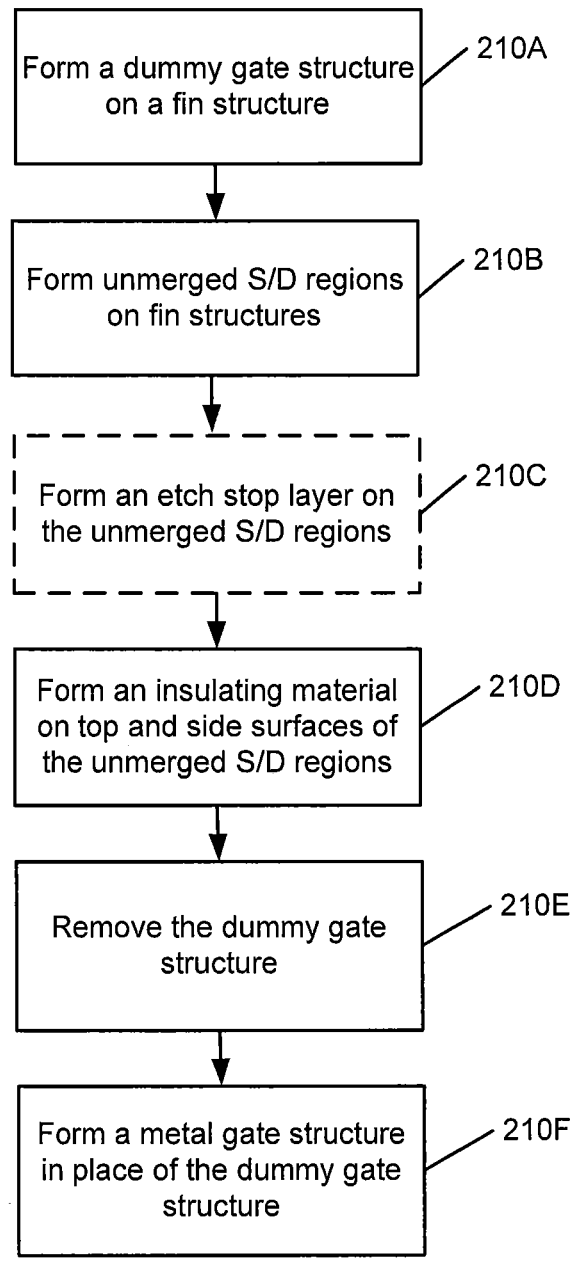

FIGS. 2A and 2B are flowcharts illustrating operations of forming semiconductor devices, according to various embodiments of present inventive concepts. In particular FIGS. 2A and 2B illustrate operations of forming the structures illustrated in FIGS. 1A and 1B.

Referring now to FIG. 2A, operations of forming the semiconductor device structures illustrated in FIGS. 1A and 1B may include replacing (Block 210) a dummy gate structure with a metal gate structure. In particular, the operation(s) of Block 210 may include a Replacement Metal Gate (RMG) operation.

In some embodiments, the metal gate structure may be formed on a plurality of the semiconductor structures 100A-100D. For example, the metal gate structure may extend in the direction D1 over each of the semiconductor structures 100A-100D. As an example, the dummy gate structure and the metal gate structure may be formed according to the operations of U.S. patent application Ser. No. 14/878,230, entitled Methods of Forming Semiconductor Devices Including Conductive Contacts on Source/Drains, the entire contents of which are hereby incorporated herein by reference. FIGS. 4-7, for example, of U.S. patent application Ser. No. 14/878,230 illustrate operations that could be used to form the dummy gate structure and the metal gate structure of the present disclosure.

The operations of forming the semiconductor device structures illustrated in FIGS. 1A and 1B may also include forming (Block 220) an opening (e.g., the opening 130 that will be described herein with respect to FIGS. 3A and 4B) over a plurality of source/drain (S/D) regions 110 that are spaced apart from each other. For example, the operation(s) of Block 220 may include forming the opening 130 over the unmerged source/drain regions 110A-110D of FIGS. 1A and 1B. A closest distance between adjacent ones of the source/drain regions 110 (e.g., a shortest distance d11, in the direction D1, between the source/drain region 110C and the source/drain region 110D) may be 2-5 nm or more.

In some embodiments, the opening 130 may be referred to herein as a trench. In particular, the opening 130 may be an elongated trench opening that exposes all of the source/drain regions 110. In other words, a trench shape may overlap the entire region of sources and/or drains for which contact is desired. For example, in a four (4)-fin design, the trench overlaps the source or drain regions of each of the 4 fins.

After replacing (Block 210) the dummy gate structure and forming (Block 220) the opening 130, the operations of forming the semiconductor device structures may include forming (Block 230) the metal layer 120 in the opening 130. In particular, the metal layer 120 may be formed to electrically connect the plurality of source/drain regions 110A-110D with each other. The metal layer 120 may be formed by, for example, a conformal deposition technique, such as Atomic Layer Deposition (ALD), among other metal-formation techniques. An advantage of forming (Block 230) the metal layer 120 after (rather than before) replacing (Block 210) the dummy gate structure is that this protects the metal layer 120 from needing to withstand an RMG thermal budget.

Formation of the metal layer 120 can be followed by various processes to improve contact resistivity, including Plasma Doping (PLAD) implantation of impurities and segregation (performed by an anneal, such as a laser-anneal or other thermal processes), or an anneal to provide metal diffusion and/or reaction at the surfaces of the source/drain regions 110A-110D. For example, a Laser Spike Annealing (LSA) process, or a similar process, may follow the formation of the metal layer 120. Additionally or alternatively, pre-amorphization implants, or other techniques known to result in low contact resistivity, can be performed.

In some embodiments, a reaction between the metal layer 120 and a material of the source/drain regions 110A-110D may form a compound between the metal layer 120 and the source and/or drain material. The reaction may be a complete reaction or a partial reaction. In other words, the whole metal layer 120 on the source/drain regions 110A-110D may be reacted or, alternatively, only a portion of the metal layer 120 on the source/drain regions 110A-110D may be reacted.

After Block 230, the operations may subsequently include forming (Block 240) the insulating material 135 on the metal layer 120, in the opening 130. For example, the insulating material 135 may be formed by oxide deposition, among other insulating-material-formation processes.

Moreover, the operations may include forming (Block 250) the contact structure 145 to only partially overlap the metal layer 120. For example, the contact structure 145 may overlap portions of the metal layer 120 that are on one or more, but not all, of the source/drain regions 110. As an example, the contact structure 145 may be on less than half of an entire uppermost surface of the metal layer 120. In some embodiments, the contact structure 145 may be formed in the insulating material 135.

Referring now to FIG. 2B, a plurality of operations of Block 210 of FIG. 2A are illustrated. For example, the operations of Block 210 of FIG. 2A may include forming (Block 210A) a dummy gate structure on a fin structure (e.g., on one or more of the fin-shaped semiconductor structures 100A-100D). As discussed above with respect to FIG. 2A, the dummy gate structure may be formed according to the operations of U.S. patent application Ser. No. 14/878,230 (e.g., according to FIG. 4 thereof).

The operations of Block 210 of FIG. 2A may also include forming (Block 210B) unmerged source/drain (S/D) regions 110 on a plurality of fin structures. For example, the operation(s) of Block 210B may include forming the source/drain regions 110A-110D on the fin-shaped semiconductor structures 100A-100D, respectively. In particular, the source/drain regions 110A-110D may be formed with some separation therebetween on adjacent fins. The source/drain regions 110A-110D may be formed (i) by a small source/drain recess followed by limited source/drain regrowth, (ii) by thin epitaxial growth around fins without a previous recess, or (iii) without recessing or growing the source/drain regions 110A-110D. The source/drain regions 110A-110D may be formed before finishing an RMG process (e.g., before performing the operations of Blocks 210E and 210F of FIG. 2B). In some embodiments, it may be beneficial for a significant portion of fin sides (e.g., >70%) not to be covered by an insulating material (e.g., the insulating materials 105, 135).

In some embodiments, the source/drain regions 110A-110D may be formed by epitaxial growth on the fin-shaped semiconductor structures 100A-100D, respectively. Although an epitaxial layer may be grown in various different ways, one example way to form the epitaxial layer is to grow the epitaxial layer around a fin (e.g., one of the fin-shaped semiconductor structures 110A-110D) without recessing the fin. For example, the source/drain region 110D may extend in the direction D2 about three (3) nm from the top surface of the semiconductor structure 100D. Moreover, the source/drain region 110D may grow laterally in the direction D1 about eight (8) nm from each of the side surfaces of the semiconductor structure 100D Referring still to FIG. 2B (and to Block 210 of FIG. 2A), the operations may optionally include forming (Block 210C) an etch stop layer (e.g., the etch stop layer 115 that will be described herein with respect to FIGS. 3A and 4B) on the unmerged source/drain regions 110. Accordingly, the structures of FIGS. 1A and 1B may optionally include the etch stop layer 115 between the source/drain regions 110 and the metal layer 120. The subsequently-formed (in Block 230 of FIG. 2A) metal layer 120 may thus be formed directly on the etch stop layer 115 or directly on the source/drain regions 110, after exposure (in Block 220 of FIG. 2A) via the opening 130. In some embodiments, the etch stop layer 115 may be a metal silicide layer that is formed by a blanket silicide process that occurs after epitaxial growth of a semiconductor material (e.g., the source/drain regions of Block 210B) and before finishing an RMG process.

The etch stop layer 115 may protect against significant erosion (or etching) of the source/drain regions 110 during removal of material between adjacent source/drain regions 110 (e.g., when forming the opening 130). The etch stop layer 115 can be a nitride layer. In some embodiments, the etch stop layer 115 can be a reacted metallic layer resulting from the reaction of a deposited metal with a material of the source/drain regions 110. For example, the reacted metallic layer may be a silicide if the source/drain material is Silicon (Si). This can occur in a self-aligned process (e.g., a silicide process if the source/drain material is Si). As an example, a Tantalum (Ta)-reacted compound (such as a Ta-silicide for a Si source/drain) can be formed. In some embodiments, reacted compounds of other refractory metals (other than Ta; e.g., compounds of Molybdenum (Mo), etc.) can be used instead. Alternatively, Cobalt (Co) silicide may be formed.

In some embodiments, the Co silicide film may be epitaxial. For example, a Titanium (Ti)-mediated epitaxial process that uses a thin Ti layer between the Co and the source/drain material can be used to form the epitaxial Co silicide. Alternatively, other types of interfacial layers (such as chemical oxides, etc.) may be used to obtain the epitaxial Co silicide. In some embodiments in which a silicide is formed in Block 210C, techniques to achieve low contact resistivity may be used, such as (i) pre-amorphization implants (e.g., using Plasma Doping (PLAD) or other implantation techniques) that are performed before metal deposition, or (ii) impurity segregation (e.g., implantation into the metal or silicide, followed by an anneal), among other techniques.

If the etch stop layer 115 is metallic and already provides sufficient wrap-around of a significant portion (e.g., >70%) of the fin height and conduction (e.g., Rs<150 ohm/sq), then the formation of the opening 130 can be performed to uncover only/primarily the top portions of the unmerged source/drain regions 110 (on the semiconductor structures 100). Alternatively, the opening 130 can partially uncover the side surfaces of the source/drain regions 110. In some embodiments, the opening 130 can uncover a large portion of the side surfaces of the source/drain regions 110.

For example, if the etch stop layer 115 is not metallic or does not wrap around (e.g., wrap around more than (>) 70%) of the side surfaces of the source/drain regions 110 or is not sufficiently conductive (e.g., Rs>150 ohm/sq), then the opening 130 may be formed by etching an oxide (or another insulating material) that is between the unmerged source/drain regions 110, and uncovering the unmerged source/drain regions 110 to expose the side surfaces of the source/drain regions 110 (e.g. >70% of the fin height). If the etch stop layer 115 is an insulating layer, or does not provide sufficient contact, then it may be removed from the top and exposed side surfaces of the unmerged source/drain regions 110 before forming the metal layer 120.

In some embodiments in which the etch stop layer 115 includes a silicide, the metal layer 120 may include a metal (e.g., Nickel (Ni) or even the same metal used to form the silicide) that can inter-diffuse through the silicide to form a new interface to the source/drain regions 110. This may be beneficial for reducing contact resistance.

Moreover, referring still to FIG. 2B (and to Block 210 of FIG. 2A), the operations may include forming (Block 210D) the insulating material 105 on top and side surfaces of the Immerged source/drain regions 110. The operations may also include removing (Block 210E) the dummy gate structure, as well as forming (Block 210F) a metal gate structure in place of the dummy gate structure. As discussed above with respect to FIG. 2A, the metal gate structure may be formed according to the operations of U.S. patent application Ser. No. 14/878,230 (e.g., according to FIGS. 6 and 7 thereof). In some embodiments, a plurality of metal gate structures may be formed in the semiconductor device and may spaced apart from each other in a direction (e.g., a direction that points into the page of FIG. 1A) that is perpendicular to both the direction D1 and the direction D2. Referring to FIGS. 2A and 2B together, the inventive entity appreciates that the operations of Blocks 210A-210F of FIG. 2B are performed before forming the metal layer 120 in Block 230 of FIG. 2A.

Figure 3A:
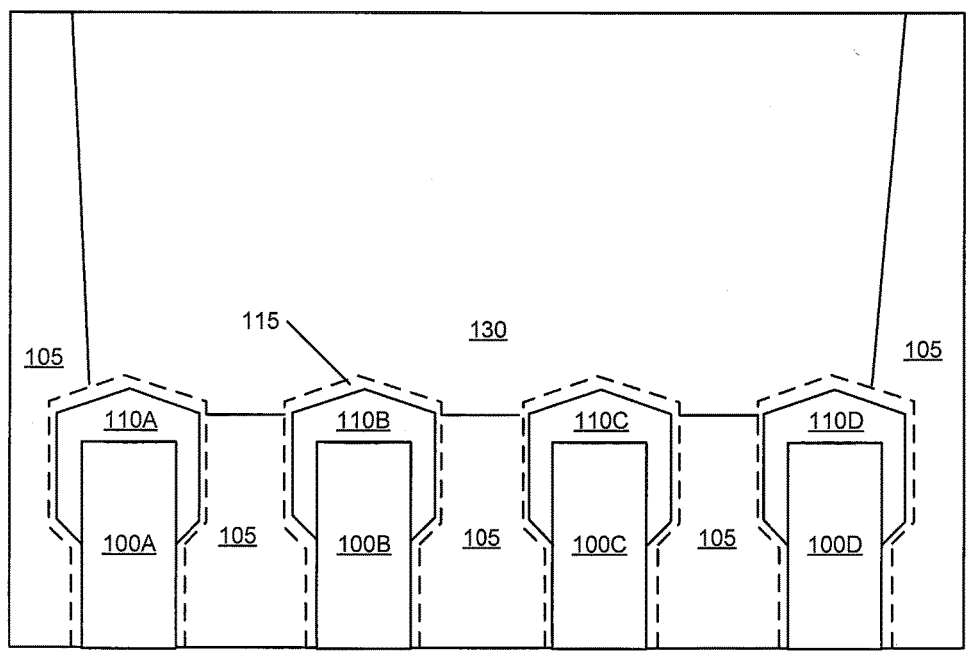
FIGS. 3A-5 are cross-sectional views illustrating operations of forming semiconductor devices, according to various embodiments of present inventive concepts.
Figure 3B:
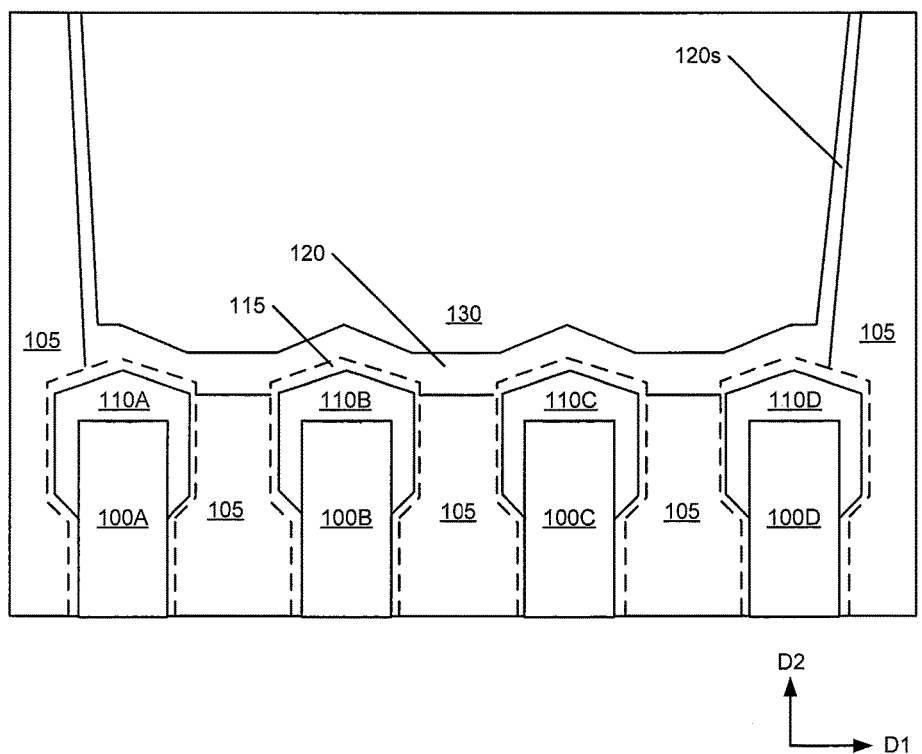
Figure 3C:
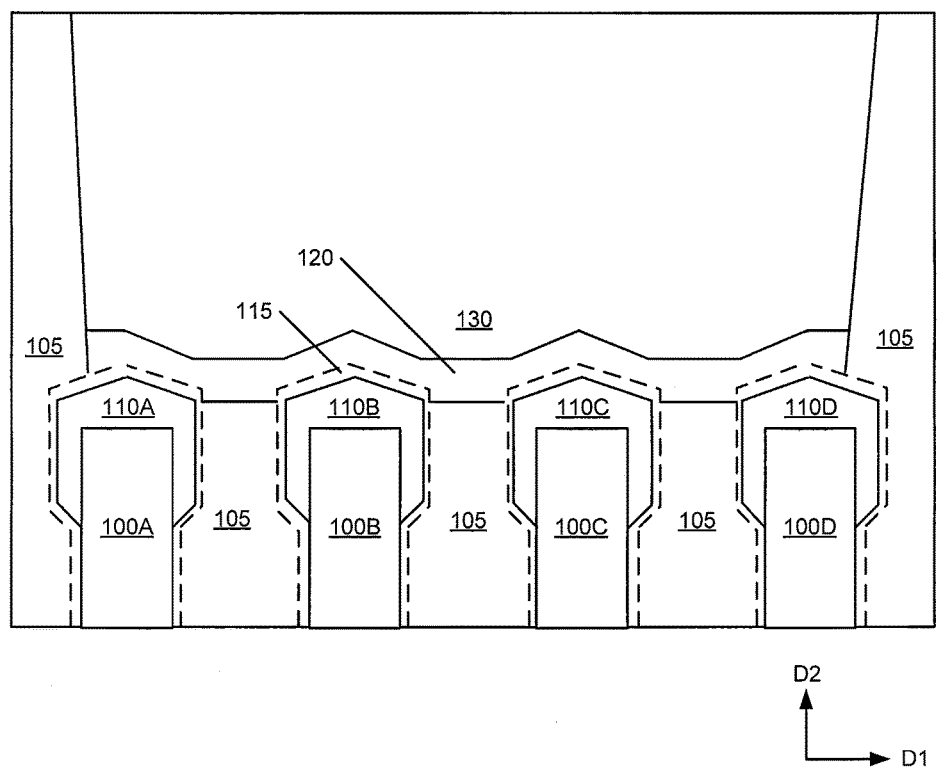
Figure 3D:
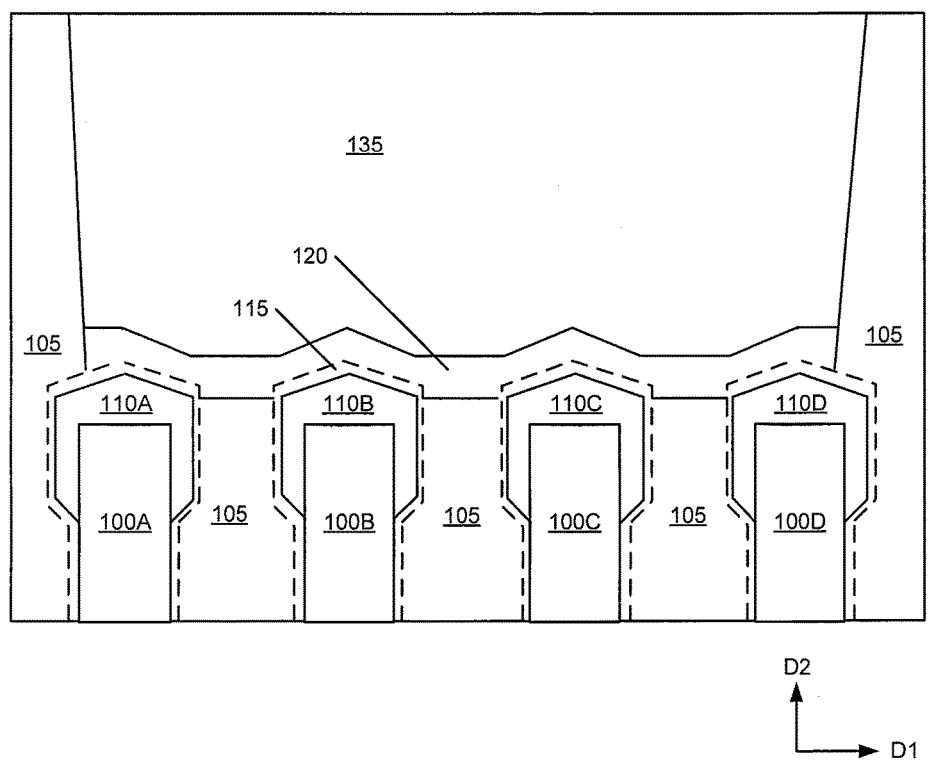
Figure 3E:
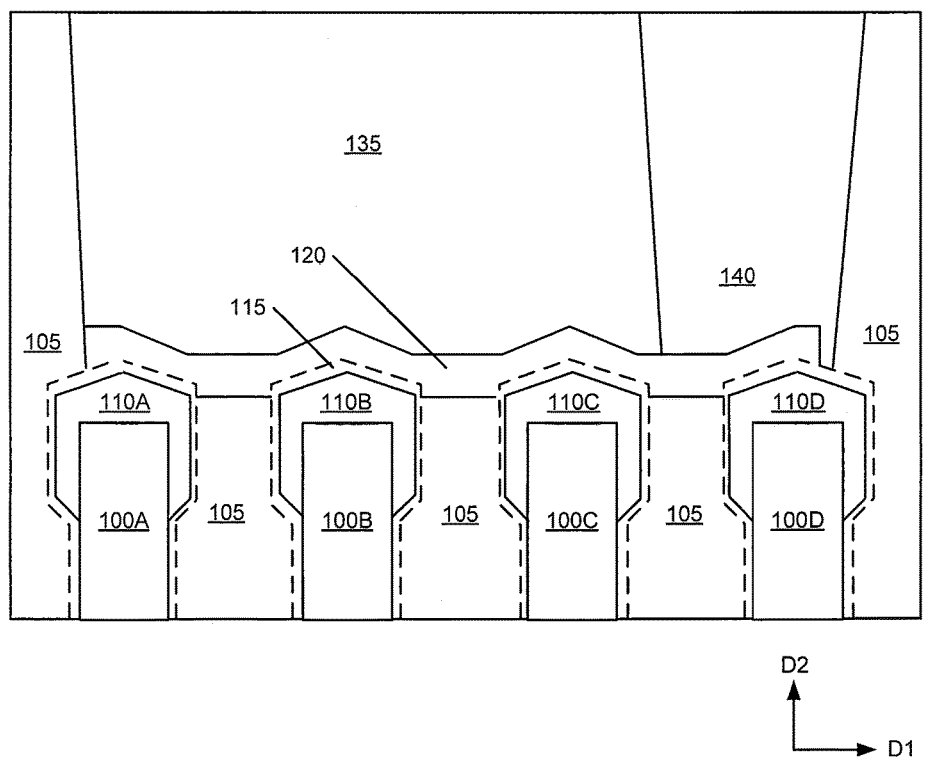
Figure 3F:
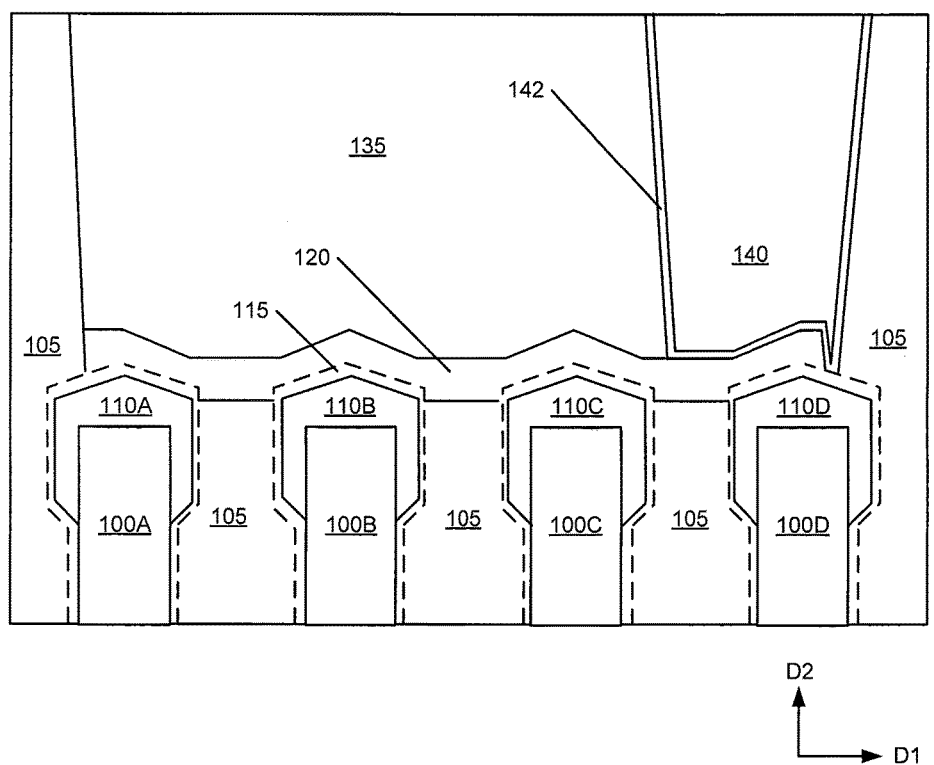
Figure 3G:
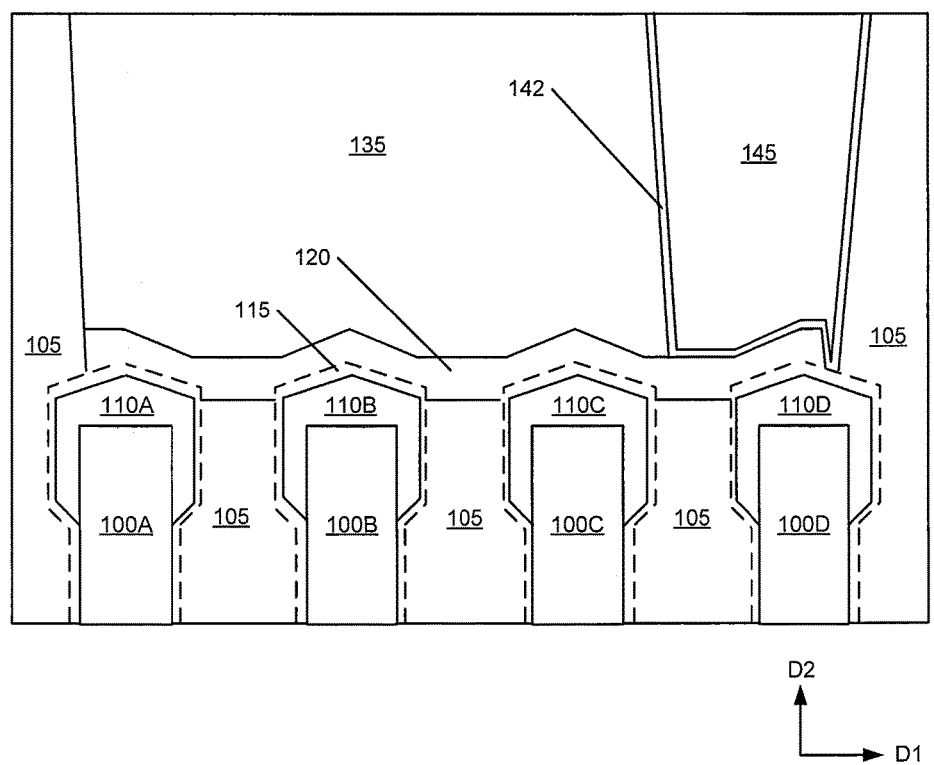
Figure 4A:
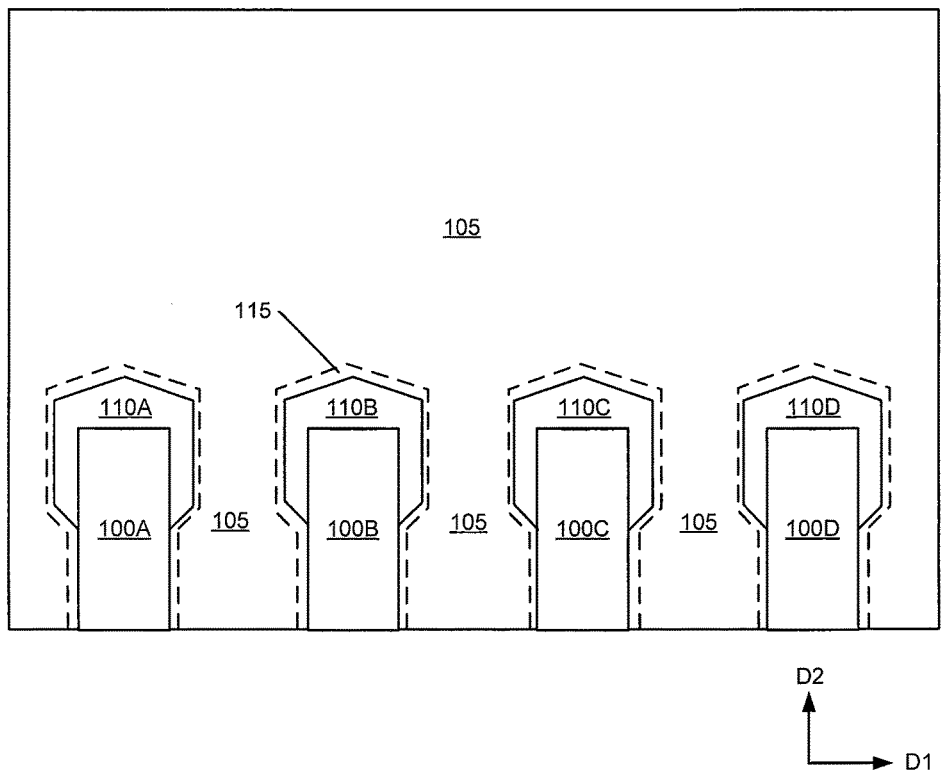
Figure 4B:
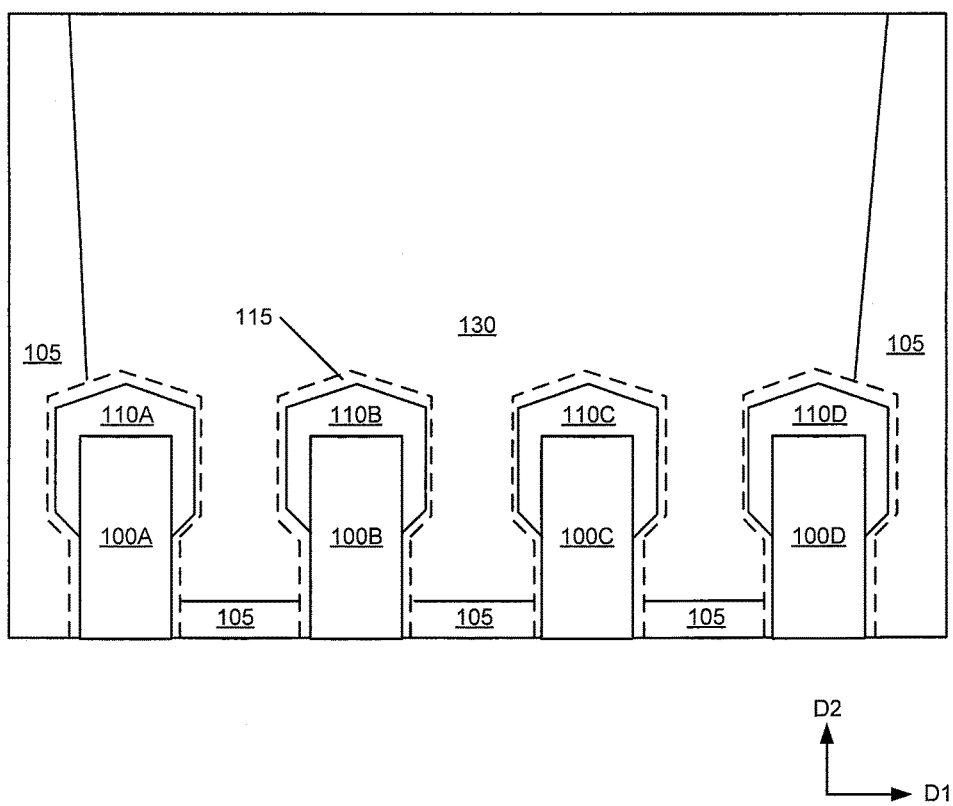
Figure 4C:
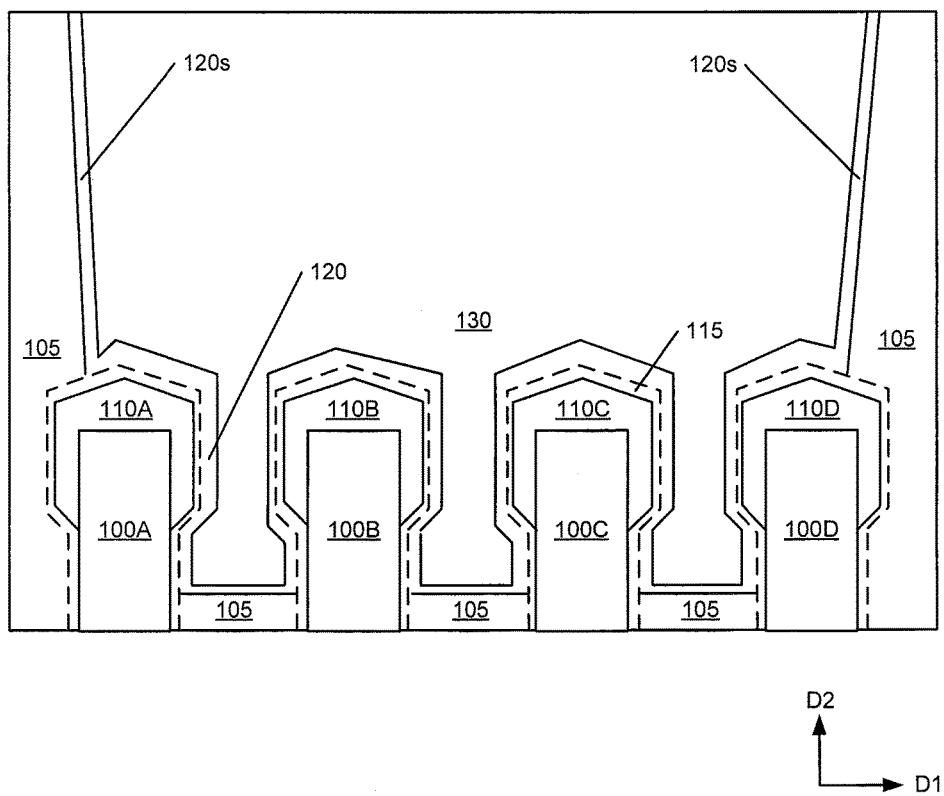
Figure 4D:
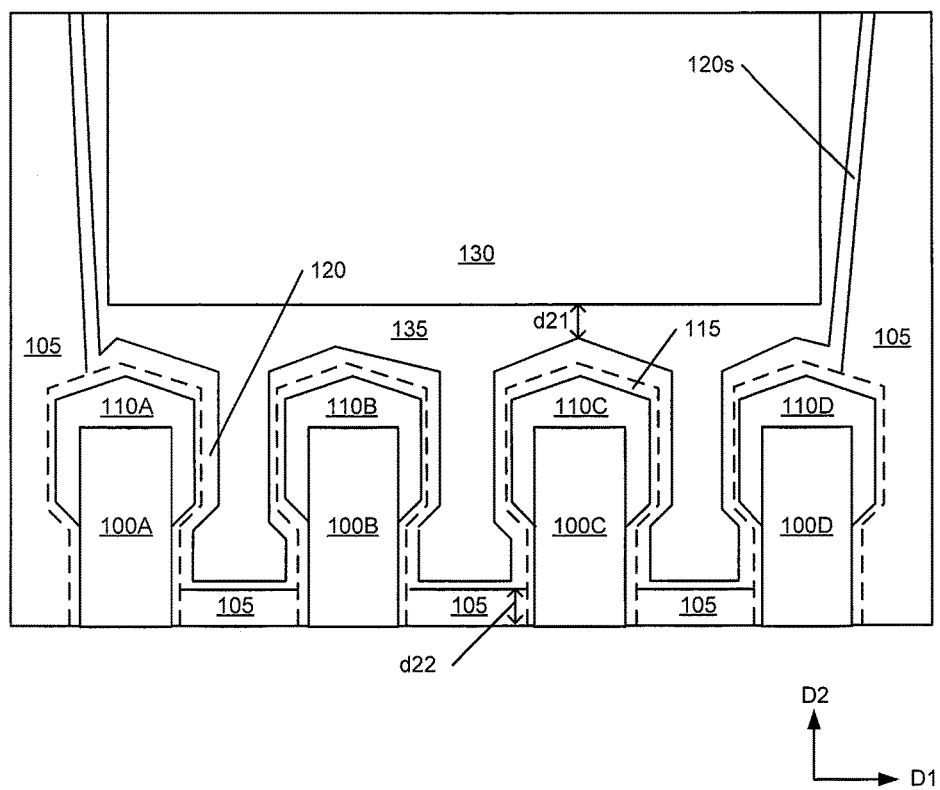
Figure 4E:
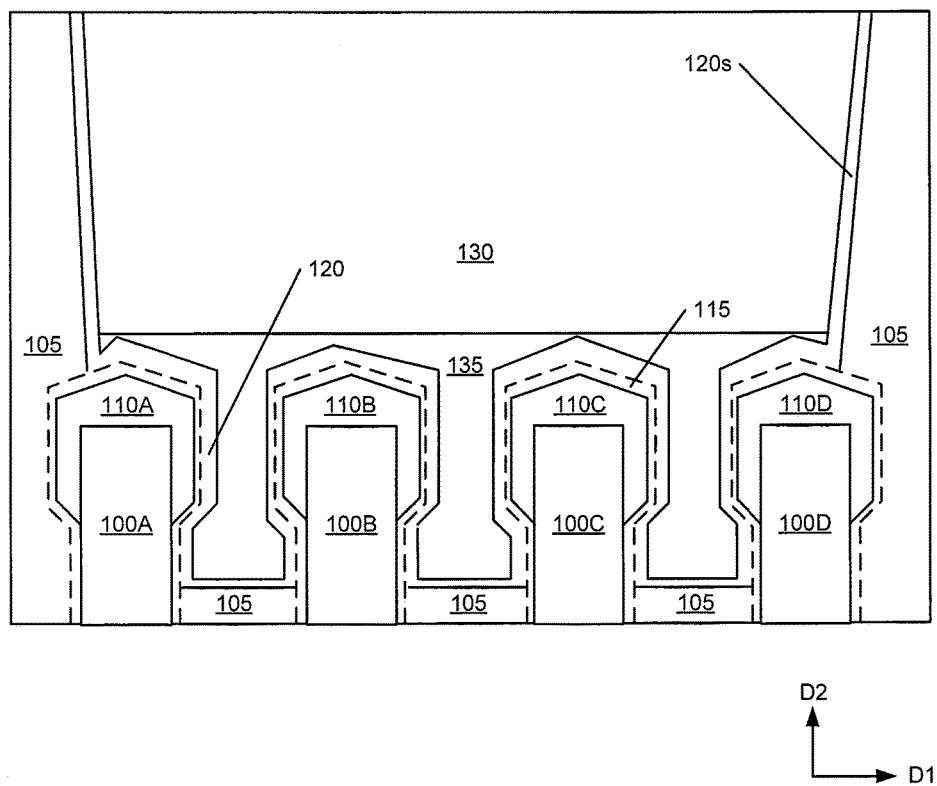
Figure 4F:
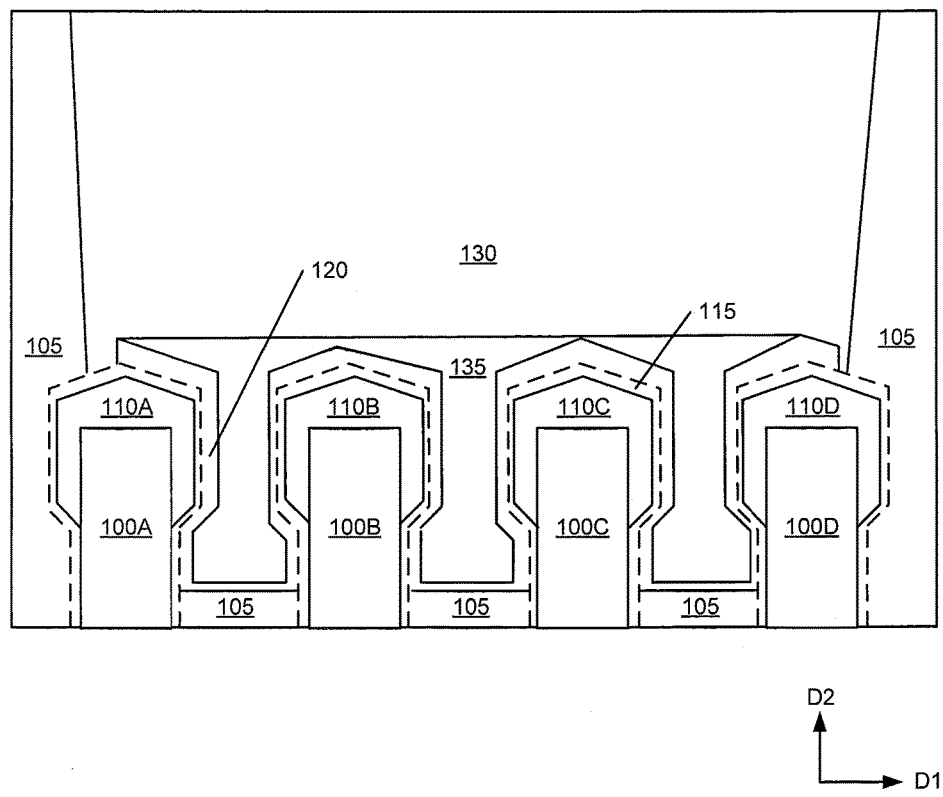
Figure 4G:
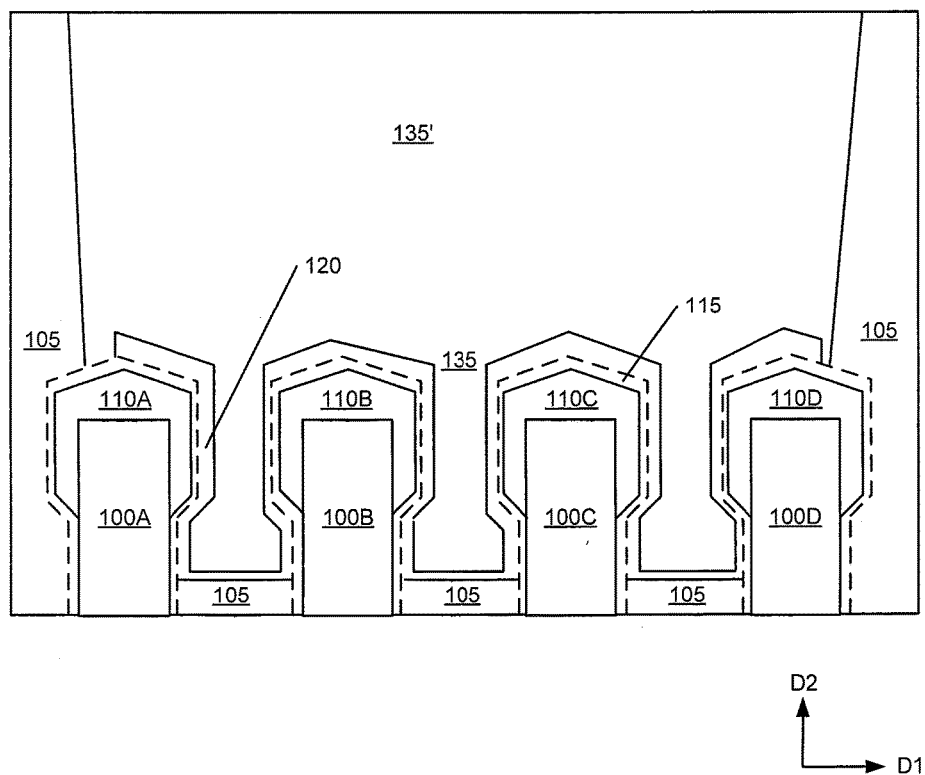
Figure 4H:
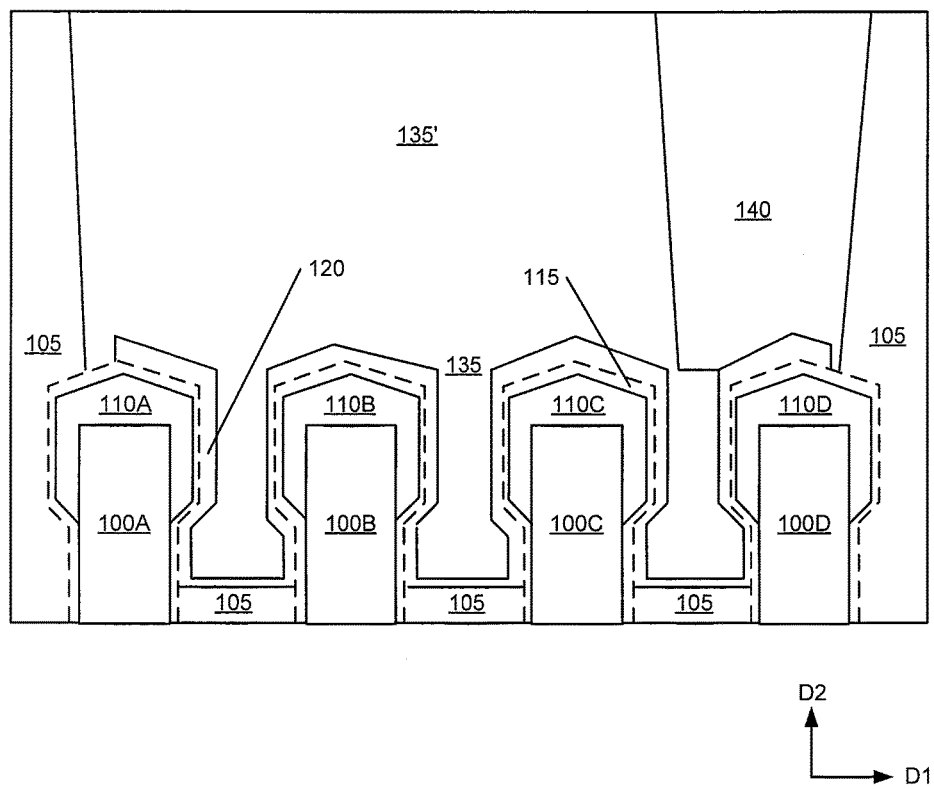
Figure 4I:
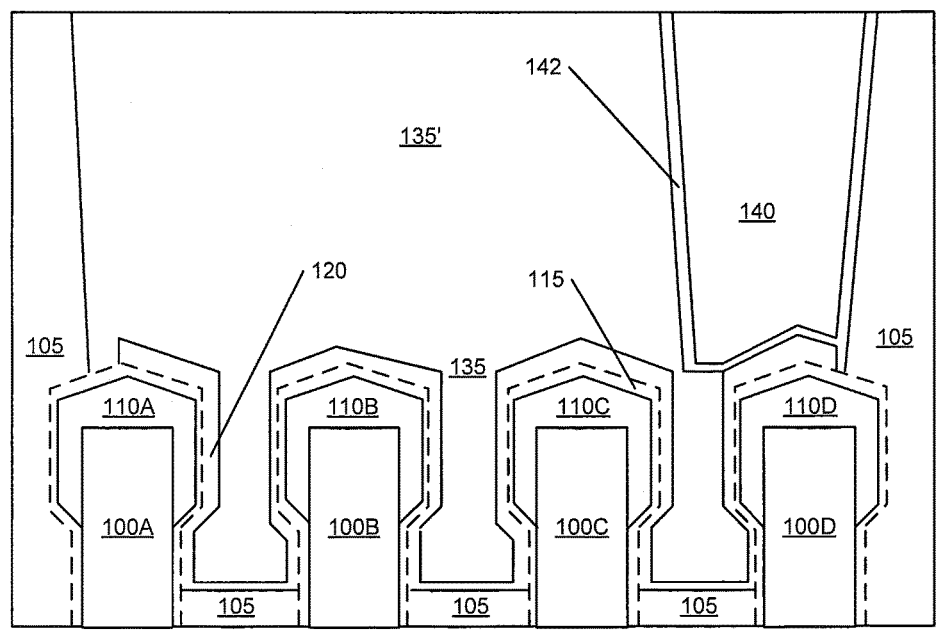
Figure 4J:
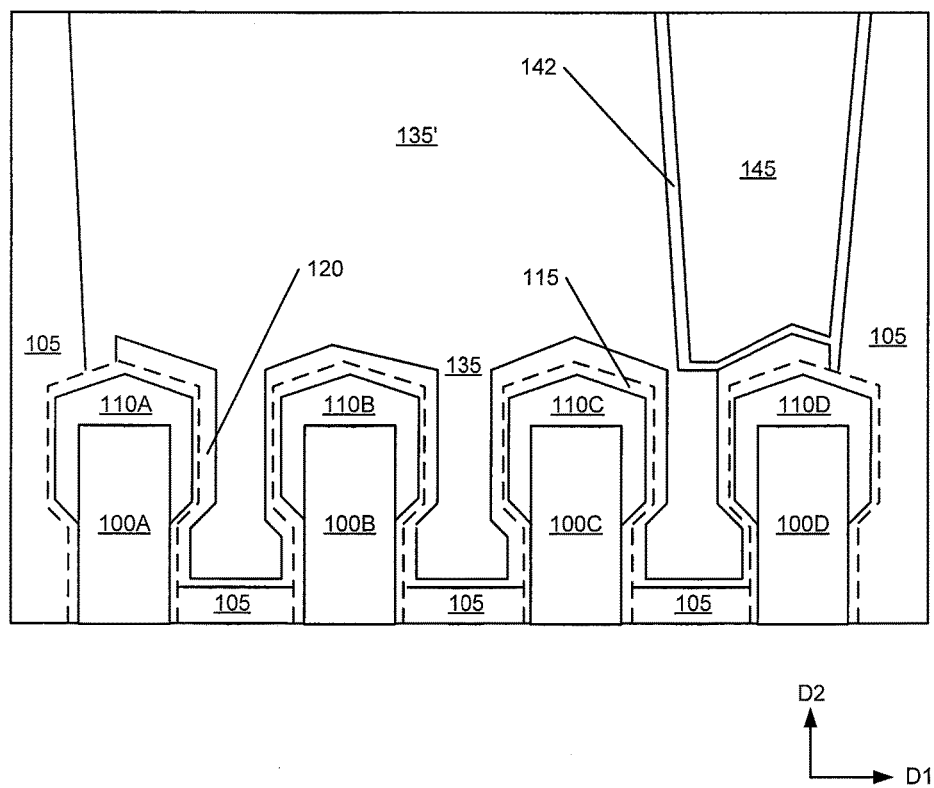
Figure 5:
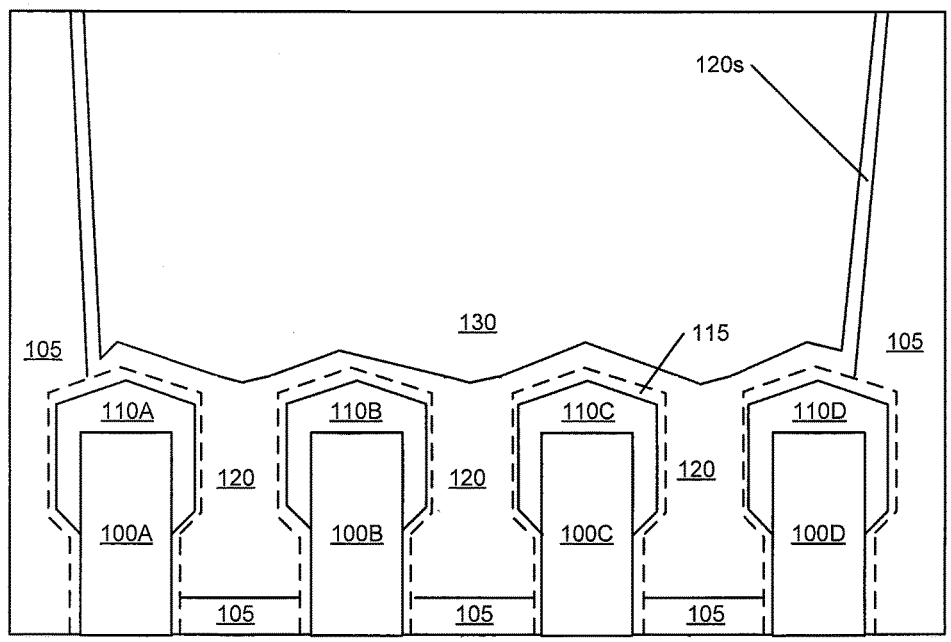

FIGS. 3A-5 are cross-sectional views illustrating operations of forming semiconductor devices, according to various embodiments of present inventive concepts. In particular, FIGS. 3A-3G illustrate cross-sectional views of forming the structure of FIG. 1A according to some embodiments of the operations of FIGS. 2A and 2B. Moreover, FIGS. 4A-4J illustrate cross-sectional views of forming the structure of FIG. 1B according to some embodiments of the operations of FIGS. 2A and 2B. FIG. 5 illustrates a modification to FIG. 4C.

Referring now to the cross-sectional view in FIG. 3A, which corresponds to Block 220 of FIG. 2A, an opening 130 (e.g., a trench) is formed over the source/drain regions 110A-110D. The opening 130 may be formed by removing portions of the insulating material 105, to expose at least a portion of each of the respective top surfaces of the source/drain regions 110A-110D. Alternatively, if the etch stop layer 115 is formed on the source/drain regions 110A-110D, then the opening 130 may expose the etch stop layer 115 on at least a portion of each of the respective top surfaces of the source/drain regions 110A-110D.

Referring now to the cross-sectional view in FIG. 3B, which corresponds to Block 230 of FIG. 2A, a metal layer 120 is formed in the opening 130. The metal layer 120 may be formed to a thickness between two (2) and twenty (20) nanometers (nm) on the source/drain regions 110A-110D. Because the metal layer 120 is a relatively thin metal layer (with a small cross section, from the perspective of the gate), semiconductor devices that include the metal layer 120 may have ultra-low parasitic capacitances.

In some embodiments, the metal layer 120 may be directionally deposited in the opening 130 so that the metal layer 120 is thicker on the source/drain regions 110A-110D than on sidewalls of the opening 130. As a result of the directional deposition, vertically-extending (e.g., sidewall) portions 120s of the metal layer 120 may be thinner, in the direction D1, than the portions of the metal layer 120 on the source/drain regions 110A-110D are in the direction D2. For example, the metal layer 120 may be 2-20 nm thick, in the direction D2, on the source/drain region 110C, which thickness may be thicker than the thickness, in the direction D1, of the vertically-extending portions 120s of the metal layer 120. In particular, if only the top portions of the source/drain regions 110A-110D are exposed (or if the portions of the side surfaces that are exposed is not very deep), then the directional deposition may be beneficial such that the resulting metal film/layer 120 in the bottom of the opening 130 (in electrical contact with the tops of the source/drain regions 110A-110D) is thicker than the resulting metal film/layer 120s on the sidewalls of the opening 130. Although directional metal deposition is one way to form the metal layer 120, the present inventive entity appreciates that any type of metal deposition may be used to form the metal layer 120.

Referring now to the cross-sectional view in FIG. 3C, the vertically-extending (e.g., sidewall) portions 120s of the metal layer 120 may be removed (e.g., may be etched). This removal may expose sidewall portions of the insulating material 105 that extend in the direction D2 beyond the source/drain regions 110A-110D. In particular, this removal may leave the metal layer 120 at the bottom of the opening 130 but not on upper sidewalls of the opening 130. In other words, the metal layer 120s is removed from an upper portion of the opening 130, without removing the metal layer 120 from the tops of the source/drain regions 110A-110D. In embodiments in which a directional metal deposition was used to form the metal layer 120, an isotropic etch can be used to remove the thinner metal layer 120s that is on the sidewalls of the opening 130, thus leaving a significant portion of the thicker metal layer 120 at the bottom of the opening 130.

Referring now to the cross-sectional view in FIG. 3D, which corresponds to Block 240 of FIG. 2A, an insulating material 135 may be formed in the opening 130, on portions of the metal layer 120 that remain after the removal in FIG. 3C. In some embodiments, the insulating material 135 may fill any portion of the opening 130 that is open after the removal in FIG. 3C.

Referring now to the cross-sectional view in FIG. 3E, a contact opening 140 may be formed in the insulating material 135. The contact opening 140 is narrower, in the direction D1, than the opening 130 of FIG. 3A. In particular, whereas the opening 130 overlaps at least a portion of each of the source/drain regions 110A-110D, the contact opening 140 overlaps the metal layer 120 on one or more, but not all, of the source/drain regions 110A-110D. For example, FIG. 3E illustrates that the contact opening 140 overlaps/exposes only a portion of (rather than the entire) the upper surface of the metal layer 120.

In some embodiments, the portion of the upper surface of the metal layer 120 that the contact opening 140 overlaps/exposes is on only one of the source/drain regions 110A-110D. In other words, the contact opening 140 can optionally land on the source/drain region 110 of just one fin 100. Alternatively, the portion of the upper surface of the metal layer 120 that the contact opening 140 overlaps/exposes may be on only two or only three (but not all four) of the source/drain regions 110A-110D. The contact opening 140 may be referred to herein as a partial trench contact opening, as the contact opening 140 has a shorter length along the direction D1 perpendicular to the fins 100A-100D than does a full strap trench contact opening (e.g., the opening 130). Moreover, the contact opening 140 extends downward in the direction D2 to reach a point (e.g., a portion of the metal layer 120 and/or a metal silicide of the etch stop layer 115) that is electrically connected to each of the source/drain regions 110A-110D.

Referring now to the cross-sectional views in FIGS. 3F and 3G, which correspond to Block 250 of FIG. 2A, a contact structure may be formed in the contact opening 140. As illustrated in FIG. 3G, the contact structure may include a metal contact 145. Moreover, referring to FIG. 3F, the contact structure may optionally include a liner metal and/or barrier metal 142 that may be formed in the contact opening 140 before forming the metal contact 145. In particular, forming the metal contact 145 may include filling the contact opening 140 with metal after forming the liner metal and/or barrier metal 142 in the contact opening 140. Because the contact opening 140 is narrower than the opening 130, the contact structure 142/145 that is formed in the contact opening 140 only partially overlaps the metal layer 120.

Referring now to the cross-sectional view in FIG. 4A, which corresponds to Block 210D of FIG. 2B, an insulating material 105 may be formed on top and side surfaces of the source/drain regions 110A-110D. In some embodiments, the operation(s) illustrated in FIG. 4A may also be performed before the operation(s) illustrated in FIG. 3A. In other words, the present inventive entity appreciates that the formation of the opening 130 in FIG. 3A may be preceded by forming the insulating material 105 on top and side surfaces of the source/drain regions 110A-110D.

Referring now to the cross-sectional view in FIG. 4B, which corresponds to Block 220 of FIG. 2A, an opening 130 (e.g., a trench) is formed over the source/drain regions 110A-110D. The opening 130 in FIG. 4B is deeper than the opening 130 in FIG. 3A. Specifically, forming the opening 130 in FIG. 4B may include at least partially removing the insulating material 105 from between the source/drain regions 110A-110D.

The opening 130 may expose at least a portion of each of the respective top surfaces of the source/drain regions 110A-110D. Alternatively, if the etch stop layer 115 is formed on the source/drain regions 110A-110D, then the opening 130 may expose portions of the etch stop layer 115 on the respective top surfaces of the source/drain regions 110A-110D. Moreover, as illustrated in FIG. 4B, the opening 130 may expose at least one side surface of each of the source/drain regions 110A-110D (or may expose side surfaces of the etch stop layer 115, if the etch stop layer 115 is formed).

In some embodiments, the opening 130 may be formed by etching the insulating material 105 (e.g., via an oxide etch) that is formed in FIG. 4A. As a result of the etching, sharp corners of the source/drain regions 110A-110D may be rounded and each side of the source/drain regions 110A-110D may be shortened by about 1.5 nm in the direction D1. Accordingly, referring to FIGS. 1B and 4B, if the distance d11 is seven (7) nm before the etching, it will increase to ten (10) nm as a result of the etching.

Referring now to the cross-sectional view in FIG. 4C, which corresponds to Block 230 of FIG. 2A, a metal layer 120 is formed in the opening 130 of FIG. 4B. In particular, in embodiments where side surfaces of the source/drain regions 110A-110D are significantly exposed/uncovered by the opening 130, a conformal metal deposition may be used to provide good coverage and wrap-around of the unmerged source/drain regions 110A-110D by the metal film/layer 120. For example, a Metal-Insulator-Semiconductor (MIS) scheme can optionally be used.

FIG. 4C illustrates that the metal layer 120 may be conformally formed on top and side surfaces of the source/drain regions 110A-110D (and/or on top and side surfaces of the etch stop layer 115, if the etch stop layer 115 is formed and is metallic). If the etch stop layer 115 is formed and is non-metallic, then the non-metallic etch stop layer 115 may be removed before forming the metal layer 120. As discussed with respect to FIG. 3B, the metal layer 120 may have a thickness of 2-20 nm on the source/drain regions 110A-110D. As further discussed with respect to FIG. 3B, because the metal layer 120 is a relatively thin metal layer, semiconductor devices that include the metal layer 120 may have ultra-low parasitic capacitances (e.g., ultra-low gate to source/drain capacitance).

Referring now to FIG. 4D, which corresponds to Block 240 of FIG. 2A, an insulating material 135 may be formed in the opening 130 of FIG. 4C, on top and side surfaces of the metal layer 120. Accordingly, the insulating material 135 of FIG. 4D may be on portions of the metal that are between side surfaces of adjacent ones of the source/drain regions 110A-110D. Moreover, the insulating material 135 may only partially fill the opening 130 of FIG. 4C. In particular, FIG. 4D illustrates that a portion of the opening 130 remains open. For example, in embodiments in which a conformal metal deposition was used to form the metal layer 120 (e.g., to wrap around exposed sidewalls of the source/drain regions 110A-110D), a partial conformal (e.g., ALD) oxide fill can be used to fill the bottom of the trench contact opening 130.

It may be beneficial to have at least a 2-10 nm margin d21 between the top of the metal layer 120 and the top of the insulating material 135. For example, it may be beneficial to have at least 2-10 nm of oxide on top of the metal layer 120 to protect against etching the portions of the metal layer 120 that are on the tops of the source/drain regions 110A-110D. Although the margin d21 is described as being a 2-10 nm margin, the present inventive entity appreciates that the margin d21 may be greater than 10 nm in some embodiments. Moreover, a thickness d22 of the insulating material 105 between the semiconductor structures 100A-100D may be at least twenty-five (25) nm. The present inventive entity appreciates that the distances/thicknesses illustrated in the drawings herein (e.g., d21 and d22 in FIG. 4D) may not be shown to scale. For example, the thickness d22 may be at least double the distance d21, in some embodiments.

Referring now to FIG. 4E, the insulating material 135 of FIG. 4D may be partially removed to expose vertically-extending (e.g., side) surfaces 120s of the metal layer 120. Portions of the insulating material 135 may remain, however, on portions of the metal layer 120 that are on top and side surfaces of the source/drain regions 110A-110D. For example, in embodiments in which a conformal metal deposition was used to form the metal layer 120, a partial conformal oxide fill (e.g., using the insulating material 135) may be followed by removal of a thin layer of oxide at the sidewalls of the upper portions of the opening 130.

Referring now to FIG. 4F, the vertically-extending surfaces 120s of the metal layer 120 may be removed. For example, the removal in FIG. 4F may be similar to the removal discussed above with respect to FIG. 3C. Moreover, the portions of the metal layer 120 that are on top and side surfaces of the source/drain regions 110A-110D may be protected by the insulating material 135 during the removal of the vertically-extending surfaces 120s of the metal layer 120. For example, in embodiments in which a conformal metal deposition was used to form the metal layer 120, a partial conformal oxide fill that is followed by removal of a thin layer of oxide at upper portions of the opening 130 may further be followed by removal of the metal layer 120s at the sidewalls of the upper portions of the opening 130. Alternatively, a full oxide fill (e.g., using the insulating material 135) of the opening 130 can be followed by a partial removal of the oxide from the top of the opening 130. The partial removal may leave the tops of the source/drain regions 110A-110D covered by oxide, and may be followed by removal of the metal 120s from the sidewalls of the upper portions of the trench contact opening 130.

Referring now to FIG. 4G, an insulating material 135' may be formed on the insulating material 135. In some embodiments, the insulating material 135' may fill the unfilled portions of the opening 130 illustrated in FIG. 4F. The insulating materials 105, 135, and 135' may be different respective layers/regions of the same material (e.g., the same oxide) or may include different insulating materials. In some embodiments, each of the insulating materials 105, 135, and 135' may be referred to herein as a dielectric (e.g., an oxide or another dielectric).

Referring now to the cross-sectional view in FIG. 4H, a contact opening 140 may be formed in the insulating materials 135' and 135. As discussed above with respect to FIG. 3E, the contact opening 140 is narrower, in the direction D1, than the opening 130.

Referring now to the cross-sectional views in FIGS. 4I and 4J, which correspond to Block 250 of FIG. 2A, a contact structure may be formed in the contact opening 140 of FIG. 4H. As discussed above with respect to FIGS. 3F and 3G, the contact structure may include a metal contact 145, and may optionally include a liner metal and/or barrier metal 142. Because the contact opening 140 in FIG. 4H is narrower than the opening 130, the contact structure 142/145 that is formed in the contact opening 140 only partially overlaps the metal layer 120.

Referring now to FIG. 5, a modification to the metal formation in FIG. 4C is illustrated. In particular, the metal layer 120 is formed in FIG. 5 to substantially fill spaces between adjacent ones of the source/drain regions 110A-110D. Accordingly, whereas the insulating material 135 is formed in FIG. 4D (after forming the metal layer 120 in FIG. 4C) between adjacent ones of the source/drain regions 110A-110D, operations of forming a semiconductor device using the operation(s) of FIG. 5 will subsequently including forming the insulating material 135 on top of the metal layer 120 in a fashion similar to the formation of the insulating material that is illustrated in FIG. 3D. In other words, when using the operation(s) of FIG. 5, spaces between the source/drain regions 110A-110D will be mostly occupied by the metal layer 120 rather than the insulating material 135. After forming the insulating material 135 (e.g., to fill the opening 130 that is illustrated in FIG. 5) on the metal layer 120 that is formed according to FIG. 5, operations similar to those illustrated in FIGS. 4E-4J may be performed.

Moreover, when removing the side surfaces 120s (of the metal layer 120) that are illustrated in FIG. 5, it may be beneficial to have at least a 2-10 nm margin between the top of the metal layer 120 and the top of the insulating material 135. For example, it may be beneficial to have at least 2-10 nm of oxide on top of the metal layer 120 to protect against etching the portions of the metal layer 120 that are on the tops of the source/drain regions 110A-110D.

Accordingly, various embodiments illustrated in FIGS. 2A-5 may provide operations of forming contacts to the sources and/or drains of semiconductor devices (such as FinFETs, nanowire MOSFETs or nano-sheet MOSFETs) in which the sources (or drains) of adjacent structures of a given device (e.g., adjacent fins on a multiple-fin device) are unmerged. Referring again to Block 220 of FIG. 2A, the operations may include opening a trench contact opening (e.g., the opening 130) that overlaps, at least partially, each and all of the sources or drains (e.g., the source/drain regions 110) of the structures 100 of a given device that need to be contacted. In other words, the trench contact opening is formed such that each and all of the source or drain areas that need to be contacted are at least partially exposed through the opening.

In some embodiments, an etch stop layer (e.g., the etch stop layer 115) may be formed on the sources and/or drains to protect against erosion (or etching) of the source and/or drain material during the opening of the trench contact opening. For example, the etch stop layer may be a silicide layer that is formed on the sources and/or drains prior to opening the trench contact opening. In some embodiments, the silicide layer may wrap around the sources and/or drains to cover at least a portion of the sides of the sources and drains.

Referring again to Block 230 of FIG. 2A, the operations may include forming a thin metallic film (e.g., the metal layer 120) through the trench contact opening to provide a connecting path between the source or drains of the structures 100 that need to be contacted. In some embodiments, the metallic layer at least partially wraps around the side surfaces of the sources and/or drains. Referring again to Block 240 of FIG. 2A, the operations may include partially or completely filling the trench contact opening with a dielectric material (e.g., the insulating material 135). Moreover, the operations may include forming/opening a second contact opening (e.g., the opening 140) that has a smaller dimension than the original trench contact opening, thus exposing a portion of the metallic film. The contact structure 145 may then be formed in the second contact opening.

Accordingly, among other advantages, the operations described herein may be used to form a device that has lower parasitic RC and higher intrinsic AC performance, due to, for example, the formation of partial strap, low parasitic capacitance contacts that are for multiple fins with unmerged source/drain regions.

Example embodiments are described herein with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of present inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments of present inventive concepts should not be construed as limited to the particular shapes illustrated herein but may include deviations in shapes that result, for example, from manufacturing.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of present inventive concepts.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the true spirit and scope of present inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A method of forming a semiconductor device, the method comprising:
    replacing a dummy gate structure with a metal gate structure;
    forming an opening over spaced-apart source/drain regions of respective semiconductor structures;
    forming a metal layer in the opening, on the spaced-apart source/drain regions, after replacing the dummy gate structure with the metal gate structure, wherein the opening comprises a first opening that comprises a trench;
    forming a first insulating material on the metal layer, wherein the first insulating material, and/or a second insulating material that is formed before forming the metal layer, is between the spaced-apart source/drain regions; and
    forming, in the first insulating material, a contact structure that only partially overlaps the metal layer,
    wherein forming the contact structure comprises:
        forming, in the first insulating material, a second opening that is smaller than the trench; and
        forming the contact structure in the second opening.

2. The method of claim 1, wherein forming the opening comprises:
    exposing at least a portion of each of the spaced-apart source/drain regions; or
    exposing at least a portion of a silicide layer or etch stop layer on each of the spaced-apart source/drain regions.

3. The method of claim 2, wherein:
    adjacent ones of the source/drain regions are spaced apart from each other by at least five (5) nanometers;
    the semiconductor structures comprise respective fin-shaped semiconductor structures; and
    forming the contact structure comprises forming the contact structure over only one of the fin-shaped semiconductor structures.

4. The method of claim 3, wherein:
    forming the metal layer comprises forming the metal layer in the trench;
    the method further comprises removing first portions of the metal layer from sidewalls of the trench; and
    forming the first insulating material comprises forming the first insulating material on second portions of the metal layer that remain in the trench after removing the first portions of the metal layer from the sidewalls of the trench, wherein a first thickness of the first insulating material is equal to or thicker than a second thickness of the second portions of the metal layer, and wherein the second thickness of the second portions of the metal layer is between two (2) and twenty (20) nanometers.

5. The method of claim 1,
wherein forming the first insulating material comprises forming the first insulating material in the trench.

6. The method of claim 5, wherein forming the metal layer comprises directionally depositing the metal layer in the trench so that the metal layer is thicker on the spaced-apart source/drain regions than on sidewalls of the trench.

7. The method of claim 1, further comprising forming an etch stop layer on the spaced-apart source/drain regions,
wherein forming the opening comprises forming the opening while the etch stop layer is on the spaced-apart source/drain regions, before forming the metal layer.

8. The method of claim 7, wherein forming the etch stop layer comprises forming the etch stop layer on top surfaces and side surfaces of the spaced-apart source/drain regions, before replacing the dummy gate structure with the metal gate structure.

9. The method of claim 8, wherein forming the metal layer comprises forming the metal layer on the top surfaces and the side surfaces of the spaced-apart source/drain regions.

10. The method of claim 7, wherein forming the etch stop layer comprises forming a silicide layer on the spaced-apart source/drain regions, before replacing the dummy gate structure with the metal gate structure.

11. The method of claim 10, wherein forming the silicide layer comprises forming the silicide layer on top surfaces and side surfaces of the spaced-apart source/drain regions, before replacing the dummy gate structure with the metal gate structure.

12. The method of claim 1, wherein forming the opening comprises forming the opening in the second insulating material, over at least a portion of each of the spaced-apart source/drain regions, before forming the metal layer.

13. The method of claim 12,
wherein forming the opening in the second insulating material comprises at least partially removing the second insulating material from between the spaced-apart source/drain regions of the respective semiconductor structures, and
wherein forming the metal layer comprises conformally forming the metal layer on top surfaces and side surfaces of the spaced-apart source/drain regions.

14. The method of claim 13, wherein forming the first insulating material comprises forming the first insulating material between the side surfaces of the spaced-apart source/drain regions, after forming the metal layer on the top surfaces and the side surfaces of the spaced-apart source/drain regions.

15. The method of claim 1, further comprising forming the second insulating material between side surfaces of the spaced-apart source/drain regions, before forming the metal layer,
wherein forming the metal layer comprises forming the metal layer on top surfaces of the spaced-apart source/drain regions and on the second insulating material that is between the side surfaces of the spaced-apart source/drain regions, and
wherein spaces between the spaced-apart source/drain regions comprise mostly the second insulating material.

16. A method of forming a semiconductor device, the method comprising:
forming unmerged source/drain regions on semiconductor structures;
replacing a dummy gate structure with a metal gate structure;
forming a metal layer that connects the unmerged source/drain regions with each other, after replacing the dummy gate structure with the metal gate structure; and
forming a contact structure that overlaps the metal layer on one or more, but not all, of the semiconductor structures,
wherein an insulating material is between the unmerged source/drain regions.

17. The method of claim 16, wherein:
a thickness of the metal layer on the unmerged source/drain regions is between two (2) and twenty (20) nanometers;
adjacent ones of the unmerged source/drain regions are spaced apart from each other by at least five (5) nanometers; and
forming the contact structure comprises forming the contact structure on less than half of an entire uppermost surface of the metal layer.

18. The method of claim 16, further comprising:
forming the dummy gate structure on a fin structure among the semiconductor structures, wherein replacing the dummy gate structure comprises:
removing the dummy gate structure; and
forming the metal gate structure in place of the dummy gate structure;
forming a trench that spans at least a portion of each of the unmerged source/drain regions, wherein forming the metal layer comprises forming the metal layer in the trench; and
forming the insulating material, and/or another insulating material, on the metal layer.

19. A method of forming a semiconductor device, the method comprising:
forming a metal layer on uppermost surfaces of unmerged source/drain regions of respective fin-shaped semiconductor structures, after a dummy gate structure of the semiconductor device has been replaced with a metal gate structure, wherein adjacent ones of the unmerged source/drain regions are spaced apart from each other by at least two (2) nanometers;
forming an insulating material on the metal layer, wherein the insulating material, and/or an isolation region that is formed before forming the metal layer, is between the unmerged source/drain regions; and
forming, in the insulating material, a contact structure that contacts only a portion of the metal layer.

20. The method of claim 19, wherein:
a thickness of the metal layer on the source/drain regions is between two (2) and twenty (20) nanometers;
the adjacent ones of the source/drain regions are spaced apart from each other by at least five (5) nanometers;
the method further comprises forming a trench that spans at least a portion of each of the source/drain regions;
forming the metal layer comprises forming the metal layer in the trench;
forming the insulating material on the metal layer comprises forming a first insulating layer on the metal layer, in the trench;
the method further comprises removing a portion of the first insulating layer to expose vertically-extending portions of the metal layer;
the method further comprises removing the vertically-extending portions of the metal layer that are exposed; and the method further comprises forming a second insulating layer over the metal layer and the first insulating layer, after removing the vertically-extending portions of the metal layer.

* * * * *